(12) United States Patent
Kilcoyne et al.

(10) Patent No.: US 10,515,837 B2
(45) Date of Patent: Dec. 24, 2019

(54) METHOD OF WAFER BONDING OF DISSIMILAR THICKNESS DIE

(71) Applicant: Raytheon Company, Waltham, MA (US)

(72) Inventors: Sean P. Kilcoyne, Lompoc, CA (US); Eric R. Miller, Lompoc, CA (US)

(73) Assignee: Raytheon Company, Waltham, MA (US)

(*) Notice: Subject to any disclaimer, the term of this patent is extended or adjusted under 35 U.S.C. 154(b) by 0 days.

(21) Appl. No.: 15/945,341

(22) Filed: Apr. 4, 2018

(65) Prior Publication Data

US 2018/0301365 A1 Oct. 18, 2018

Related U.S. Application Data

(60) Provisional application No. 62/485,173, filed on Apr. 13, 2017.

(51) Int. Cl.
*H01L 21/683* (2006.01)
*H01L 23/00* (2006.01)
(Continued)

(52) U.S. Cl.
CPC .... *H01L 21/6835* (2013.01); *H01L 21/30625* (2013.01); *H01L 21/561* (2013.01);
(Continued)

(58) Field of Classification Search
CPC ........... H01L 21/6835; H01L 23/3185; H01L 21/568; H01L 21/561; H01L 21/30625; H01L 21/78; H01L 24/97; H01L 24/29; H01L 24/83; H01L 24/96; H01L 25/50; H01L 2221/6834; H01L 2221/68327;
(Continued)

(56) References Cited

U.S. PATENT DOCUMENTS 6,013,534 A 1/2000 Mountain
6,465,344 B1 10/2002 Barton
(Continued)

FOREIGN PATENT DOCUMENTS

WO 00/44045 A1 7/2007

OTHER PUBLICATIONS

International Search Report and Written Opinion from related PCT Application No. PCT/US2018/026337, dated Jul. 13, 2018.

*Primary Examiner* — Sonya D. McCall-Shepard
(74) *Attorney, Agent, or Firm* — Burns & Levinson, LLP; Joseph M. Maraia

(57) ABSTRACT

Methods, assemblies, and equipment are described for bonding one or more die that may be of dissimilar thickness to a wafer. The die may be fabricated and singulated with a planarized oxide layer protecting from wafer dicing and handling debris one or more metallized post structures connecting to an integrated circuit. Face sides of the die are bonded to a first handle wafer, such that the respective post structures are aligned in a common plane. The substrate material back sides of the bonded die are then thinned to a uniform thickness and bonded to a second handle wafer. The assembly may then be flipped, and the first handle wafer and protective layer including potential dicing and handling debris removed. The post structures are revealed, resulting in a composite wafer assembly including the second handle and one or more uniformly thinned die mounted thereto.

14 Claims, 4 Drawing Sheets

(51) Int. Cl.
   *H01L 21/306*   (2006.01)
   *H01L 21/78*    (2006.01)
   *H01L 21/56*    (2006.01)
   *H01L 23/31*    (2006.01)
   *H01L 25/00*    (2006.01)

(52) U.S. Cl.
   CPC ............ *H01L 21/568* (2013.01); *H01L 21/78* (2013.01); *H01L 24/29* (2013.01); *H01L 24/83* (2013.01); *H01L 24/96* (2013.01); *H01L 24/97* (2013.01); *H01L 2221/68327* (2013.01); *H01L 2221/68354* (2013.01); *H01L 2221/68368* (2013.01); *H01L 2221/68381* (2013.01); *H01L 2224/29188* (2013.01); *H01L 2224/83005* (2013.01); *H01L 2224/83896* (2013.01); *H01L 2924/05442* (2013.01)

(58) Field of Classification Search
   CPC . H01L 2221/68368; H01L 2224/29188; H01L 2221/68354; H01L 2224/83896; H01L 2224/83005; H01L 2924/05442; H01L 2221/68381
   See application file for complete search history.

(56) References Cited

U.S. PATENT DOCUMENTS

| | | |
|---|---|---|
| 7,656,012 B2 | 2/2010 | Doan |
| 2011/0147943 A1 | 6/2011 | McElrea et al. |
| 2013/0026619 A1 | 1/2013 | Chang et al. |
| 2014/0077344 A1 | 3/2014 | Pagaila et al. |
| 2015/0162258 A1 | 6/2015 | Hsu et al. |
| 2016/0189995 A1 | 6/2016 | Gondcharton et al. |

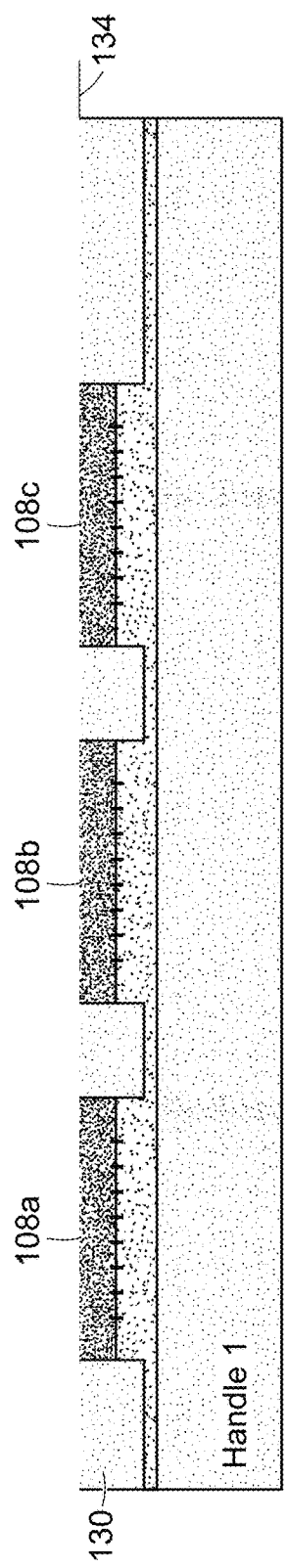
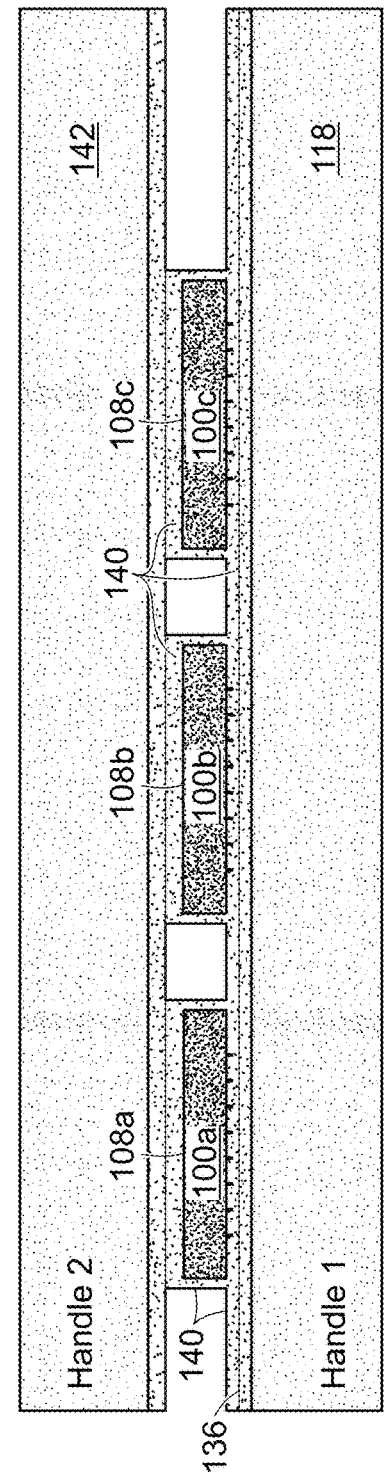

METHOD OF WAFER BONDING OF DISSIMILAR THICKNESS DIE

RELATED APPLICATIONS

This application claims priority to and the benefit of U.S. Provisional Application No. 62/485,173, filed Apr. 13, 2017, which is incorporated by reference herein in its entirety for all purposes.

BACKGROUND

1. Technical Field

The present disclosure relates generally to fabrication of integrated circuits (ICs), semiconductor devices and other miniaturized devices, and more particularly, to optimizing the yield of die-to-wafer bonding processes involving dies with dissimilar heights.

2. Discussion of Related Art

A trend in IC fabrication has been the interconnection of ICs different sizes, fabricated on different size wafers, and offering different functions (i.e., analog, digital, optical) and materials. The ICs can be tested before stacking to allow Known Good Die (KGD) to be combined to improve yield. The economic success of this vertical stacking and vertical interconnect approach depends on the yield and cost of the stacking and interconnection being favorable compared to the yield and cost associated with the increased IC or system on a chip area. A manufacturing method for realizing this approach is to vertically stack ICs using direct bond hybridization (DBH), to form a covalent bond between wafers.

One version of vertical stacking and vertical interconnection is where ICs (on a substrate) are bonded in a die-to-wafer (D2W) format where die are bonded IC-side down, to a common wafer IC-side up to allow the stacking of Known Good Die to improve yield. In order to make the cost of manufacturing an IC as small as possible, many instances of a compound semiconductor device (GaAs, InP, GaN, etc.) may be fabricated at one time on a small semiconductor wafer, typically 100 mm in diameter. Typical foundry ICs are fabricated on 200 mm diameter silicon wafers. To utilize DBH wafer bonding with devices from small wafers, the devices need to be singulated into die, and then bonded to a 200 mm wafer. Chip dicing is the process of dividing a wafer into multiple individual die, and typically involves the use of a saw blade, chemicals, a laser, or their combination to cut through and along kerf regions that run between multiple devices arranged on the wafer. Chip dicing can leave aberrations that may translate into yield lowering voids in following bonding processes. D2W bonding is typically very low yield, due to such particles generated during singulation and an inability to re-polish (e.g., CMP) the bond surface of the die due to handling limitations (i.e., in order to handle a wafer without breaking it, the wafer should have a thickness of at least 700 um). In addition, manufacturers of multi-chip modules containing more than one die are becoming very popular because of their compactness and processing power. Manufacturers of such packages are always looking for ways to reduce the size or thickness of such packages. One way of reducing the thickness of such packages is to use die that are as thin as possible.

While many methods exist for thinning an entire wafer, which is then used in its entirety, few methods exist for thinning individual die. Thus, what is needed is a D2W manufacturing process that accommodates use of dissimilarly sized, singulated die that overcomes current limitations.

SUMMARY

In accordance with certain embodiments, a technique is provided for bonding a plurality of die that may have dissimilar thicknesses to a common wafer (e.g., having a diameter of about 200 mm). The die may comprise direct bond hybridization (DBH) device structures fabricated and singulated from distinct device wafers (e.g., having diameters of about 100 mm) and a planarized oxide layer. Each singulated die has a face side, a substrate material back side, and a thickness. Each die face side includes the planarized oxide layer, which protects one or more metallized post structures connecting to a device structure formed in the die.

Each of a plurality of die may be bonded face side (circuit side) down to a front side of a first handle wafer, such that the metallized post structures associated with each of the die lie in a common plane. The plurality of die may be precisely aligned in the x-y directions with a pick and place instrument. The material substrate back sides of the bonded plurality of die may be thinned to a uniform thickness (e.g., through backgrinding and/or CMP, etc.), and a silicon dioxide layer may be deposit bonded on the thinned die back sides and on exposed surfaces of the first handle wafer. The back sides of the uniformly thinned plurality of die may then be bonded to a front side of a second handle wafer. The first handle may then be removed, and the planarized oxide layers may be removed from each face side of the plurality of uniformly thinned die to reveal the one or more metallized post structures.

In certain embodiments, one or more of the die may exhibit a region of potential aberrations that could lead to yield-lowering voids in bonding steps, where the regions result from the dicing of the die from their respective device wafer(s). The regions are generally disposed in a plane adjacent the one or more metallized post structures in each die (and between the post structures and the die-bonded first handle front face in the interim wafer assembly structure.) The regions do not negatively impact the bonding of the face sides of the die to the first handle and, advantageously, the regions will be removed with the protective planarized oxide layer associated with each die. This significantly increases yield of the process, wherein Known Good Die may be bonded in the final composite wafer structure.

In one embodiment, the process further includes fabrication of the die device structures on distinct device wafers, protecting each of the die device structures with associated oxide layers, and singulating the die. At least one of the device die may be a compound semiconductor device (e.g., GaAs, InP, GaN, etc.). The first and/or second handles may be bonded to the die by application of a low temperature oxide bonding process (such as the bonding described in U.S. Pat. No. 8,053,329, the contents of which are incorporated by reference), by DBH bonding, or by application of an adhesive between the uniformly thinned die back sides and first and second handle front sides. The first and/or second handles may be remove by thinning, resulting for the second handle in exposure of the device die.

In another embodiment, uniform thinning of the back sides of the die may optionally be preceded by filling in gaps between each of the die bonded to the first handle with a strength enhancing polymeric material prior to thinning to help maintain the relative positioning of the die during, for example, CMP processing. Then, the polymeric fill material may be removed after thinning, either prior to deposit bonding the SiO2 layer or after removing the first handle wafer.

BRIEF DESCRIPTION OF THE FIGURES

Various aspects of at least one embodiment of the present disclosure are discussed below with reference to the accompanying figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one illustrated element. Further, where considered appropriate, reference numerals may be repeated among the drawings to indicate corresponding or analogous steps or components. For purposes of clarity, not every component may be labeled in every drawing. The figures are provided for the purposes of illustration and explanation and are not intended as a definition of the limits of the invention. In the figures:

FIG. 4 schematically illustrates a step of backgrinding and/or CMP to set all die thicknesses to a uniform level;

FIG. 5 schematically illustrates a step of bonding (or tacking) a second handle wafer to the back sides of the die;

DETAILED DESCRIPTION

Figure 1:
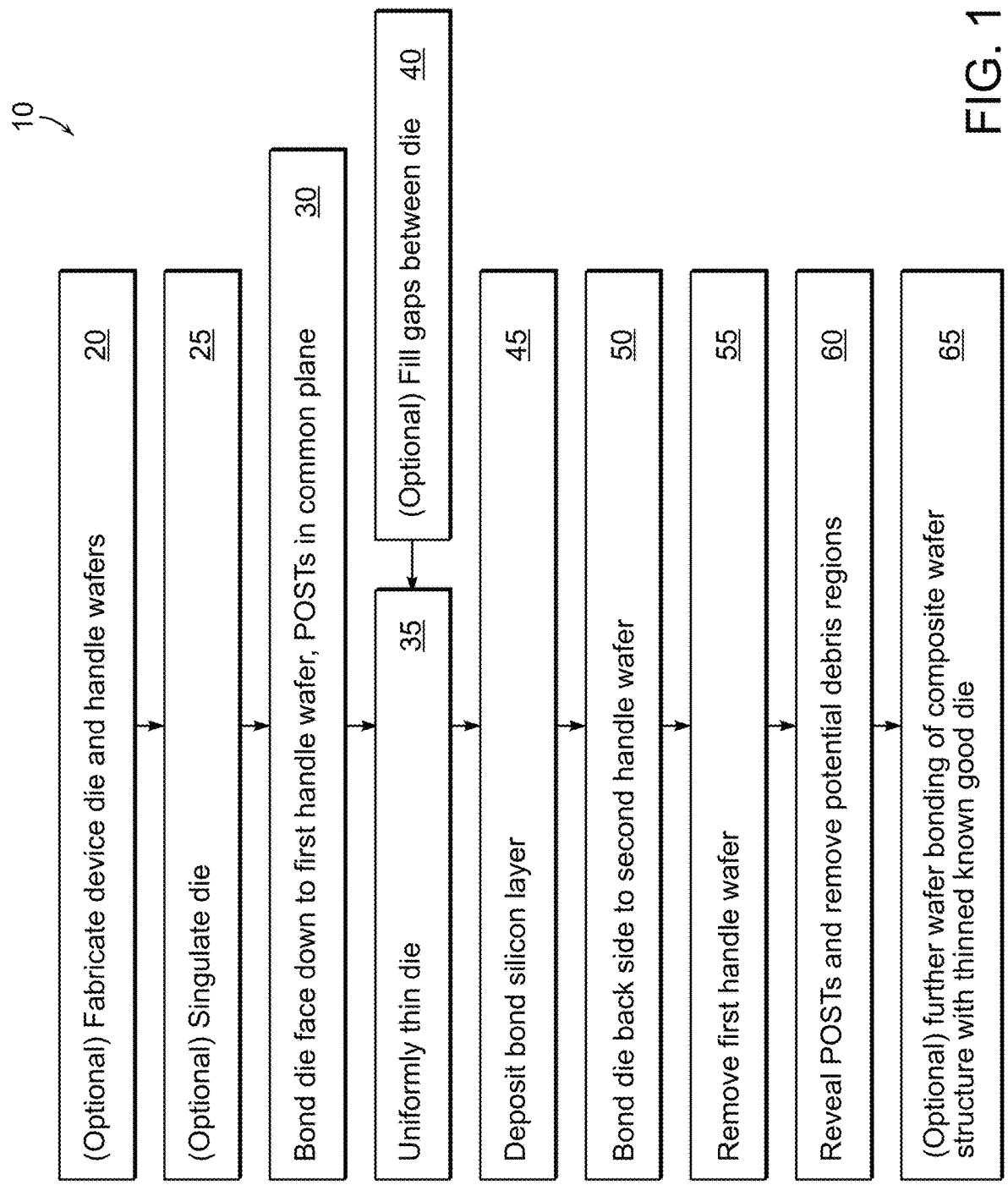
FIG. 1 is a flowchart of a method for die to wafer bonding of dissimilar thickness die, according to illustrative embodiments.

In the following detailed description, numerous specific details are set forth in order to provide a thorough understanding of the aspects of the present disclosure. It will be understood by those of ordinary skill in the art that these may be practiced without independently some of these specific details. In other instances, well-known methods, procedures, components and structures may not have been described in detail so as not to obscure the embodiments. The following descriptions of preferred embodiments are merely exemplary in nature and is in no way intended to limit the disclosure, its application, or uses. Also, it is to be understood that the phraseology and terminology employed herein are for the purpose of description only and should not be regarded as limiting. It is appreciated that certain features, are, for clarity, described in the context of separate embodiments but may also be provided in combination in a single embodiment. Conversely, various features are, for brevity, described in the context of a single embodiment but may also be provided separately or in any suitable subcombination.

No element, act, or instruction used herein should be construed as critical or essential unless explicitly described as such. Also, as used herein, the articles "a" and "an" are intended to include one or more items, and may be used interchangeably with "one or more." Further, the phrase "based on" is intended to mean "based, at least in part, on" unless explicitly stated otherwise. It will be further understood that the terms "comprise" (and any form of comprise, such as "comprises" and "comprising"), "have" (and any form of have, such as "has", and "having"), "include" (and any form of include, such as "includes" and "including"), and "contain" (and any form of contain, such as "contains" and "containing") are open-ended linking verbs. As a result, a method, structure or device that "comprises," "has," "includes," or "contains" one or more steps or elements possesses those one or more steps or elements, but is not limited to possessing only those one or more steps or elements. Furthermore, a device or structure that is configured in a certain way is configured in at least that way, but may also be configured in ways that are not listed.

For purposes of the description hereinafter, the terms "upper", "lower", "vertical", "horizontal", "front side", "back side" and derivatives thereof shall relate to the disclosed structures and methods, as oriented in the drawing figures. The terms "on top", "adjacent", "positioned on" or "positioned atop" mean that a first element, such as a first structure, is present on or in proximity to a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Referring to FIG. 1, there is illustrated an exemplary bonding process 10 for mounting a plurality of known good die with dissimilar thicknesses to a handle wafer into a 3D stack and then correcting wafer thickness variations by thinning back sides of the die in a single wafer level uniform thickness thinning process. As used herein, the term "die" is used to refer to a small piece of semiconducting material which has been fabricated (e.g., DBH bond processing, etc.) with a circuit. The term "base technology wafer" is used to refer to integrated circuits, semiconductor devices, and other miniaturized devices, including but not limited to CMOS, optoelectronics, infrared detectors, MEMS, and the like, which typically have diameters of approximately of 200 mm. The term "device wafer" is used to refer to a thin slice of semiconductor material used in the fabrication of integrated circuits, semiconductor devices, and other miniaturized devices, which have diameters smaller than the diameter of base technology wafers, typically on the order of 100 mm. The term "handle wafer" is used to refer to a wafer that provides mechanical support to other components (e.g., singulated die) while they are processed and thinned. In most die-to-wafer (D2W) applications, electronic components are built in stages on one or more device wafers and on a base technology wafer. For dissimilar size device wafers and/or different materials, device wafers are diced, and the singulated die are aligned and bonded onto die sites of a receiving base technology wafer. Conventional techniques are very low yielding, due to the fact that singulated die pick up debris from dicing and handling and cannot be cleaned or prepped for bonding, since the die cannot be loaded onto a CMP tool for final polish. The disclosed techniques overcome such obstacles, by thinning the die after bonding to a silicon handle wafer that can be cleaned and polished, and removing wafer regions where such debris may be contained.

A composite structure comprising a (e.g., silicon) handle wafer populated with uniformly thinned KGD may be fabricated by bonding method 10 that may begin with optional steps 20 of fabricating a device wafer and a first and a second silicon handle wafer and step 25 of singulating the die. Then, method 10 continues with step 30 of temporarily bonding the die to a front side the first silicon handle wafer such that device post structures of the die or POSTs are aligned in a common plane, step 35 of uniformly thinning the back sides of the bonded die, which may include an optional step 40 of filling gaps between the bonded die with a mechanical stability reinforcing polymeric material (e.g., BCB, polyimide, PR, etc.), step 45 of deposit bonding a silicon dioxide layer to the backside (back sides of thinned dies and exposed surface areas of the front side of first handle wafer, step 50 of bonding the back sides of the thinned dies to a front side of the second handle wafer, step 55 of removing the first handle wafer, and step 60 of revealing the device post structures of the die, where the process for revealing the device post structures includes removal of regions of potential singulation aberrations that may contain singulation and handling debris. These individual steps are described in greater detail with reference to FIGS. 2-7 hereinafter. In addition, optional further wafer bonding per standard processing may be performed after the final composite structure fabrication step 65, for example, to a base technology wafer.

FIGS. 2-7 schematically show a method or process for producing a composite structure comprising a (e.g., silicon) handle wafer populated with uniformly thinned known good die in accordance with method 10. FIGS. 2-7 may be considered successive individual process steps generally corresponding to the steps set forth in method 10 of FIG. 1, for ease of discussion.

Figure 2:
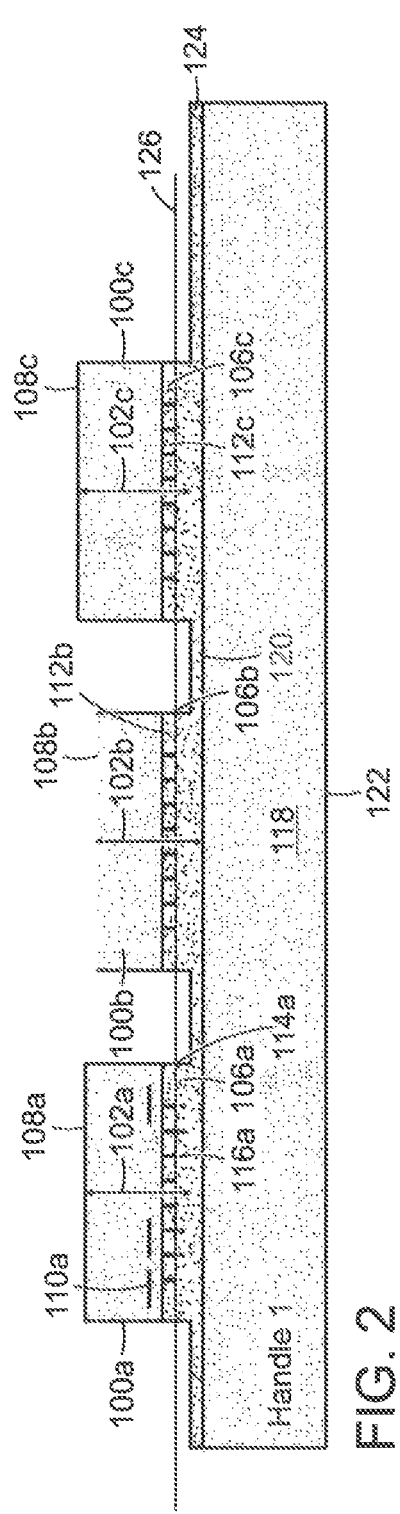
FIG. 2 schematically illustrates a step of bonding (or tacking) die of dissimilar heights to a first handle wafer.

As shown in FIG. 2, one or more die 100a-100c having variable (e.g., greater than 5 µm) thicknesses 102a-102c may have been previously fabricated in a manner known in the art on one or more device wafers and singulated. Representative die 100a includes a face (circuit) side 106a, a substrate material back side 108a, an integrated device structure 110a (e.g., a DBH structure), one or more metallized post structures 112a providing interconnection to the integrated device structure, and a protective planarized oxide layer 114a covering the post structures 112a. Within the planarized oxide layer 114a may be a region 116a of potential singulation and/or handling debris that, but for its subsequent removal by the presently disclose method 10, would otherwise lead to bonding voids and die to die variability in bonding strength due to an inability to properly CMP the composite die structure. A first silicon handle 118 including a front side 120, a back side 122, and an oxide layer 124 at the front side 120 may have also been previously fabricated. The face sides 106a-106c of the die 100a-100c and the front side 120 of the first handle wafer 118 may be prepared and temporarily bonded, such that the respective post structures 112a-112c are aligned in a common plane 126. The die 100a-110c may be precisely aligned in the X-Y plane 126 using a pick and place instrument, and may have been previously tested to be known good die. Final Z-axis alignment of the die back sides 108a-108c will be achieved by grinding and CMP. The die 100a-100c may be bonded to the front side 120 of first handle wafer 118 may be achieved through a low temperature oxide bonding process (e.g., ZiBond® bonding offered by Tessera Technologies of San Jose, Calif.), by application of a temporary adhesive (and appropriate heat and force) between the face sides 106a-106c and first wafer front side 120, allowing tacking thereto, or by similar techniques. The temporary adhesive may comprise sacrificial adhesives, thermoplastic, thermal cure, and UV cure adhesives, and may be applied by spin coating, or other known techniques.

Figure 3:
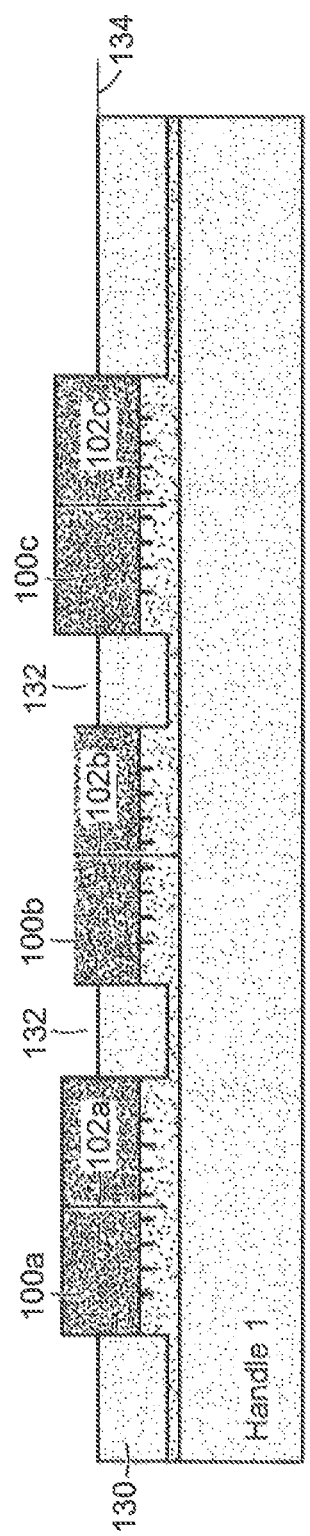
FIG. 3 schematically illustrates a step of filling gaps between die with a polymeric material.

Temporarily bonding the die 100a-100c to the first handle wafer 118 provides necessary support in order to allow for thinning and processing of the die back sides 108a-108c without breaking, warping or folding of the die. With reference to FIG. 3, optionally a polymeric material 130 may be used to temporarily fill gaps 132 between the die 100a-100c to a level 134 approximately equal to a final desired height of the die 100a-100c, if additional mechanical reinforcement is needed. This step may require annealing (e.g., 150° C.) to hold the location of the material 130. As can be seen in FIG. 4, backgrinding and CMP may be applied to the back sides 108a-108c to thin the die 100a-100c to the final desired height 136. The grinding and thinning removes the substrate material from the back sides 108a-108c of the die 100a-100c until a desired thickness (e.g., 40 µm) is achieved. The die thicknesses are preferably controlled to within 1 µm to enable high yield bonding. If a polymeric fill material 130 has been employed, it may be removed from the wafer assembly (e.g., through heat activation).

With reference to FIG. 5, the thinned back sides 108a-108c of die 100a-100c and exposed surfaces 136 of the front side 120 of the first handle wafer 118 may be prepared with a protective conformal coating 140, such as a silicon dioxide coating layer for a silicon wafer. A second handle wafer 142 may then be temporarily bonded to the prepared, planarized back sides 108a-108c of die 100a-100c. Similar bonding processes as used to bond the first wafer handle 118 to the die 100a-100c may be employed.

Figure 6:
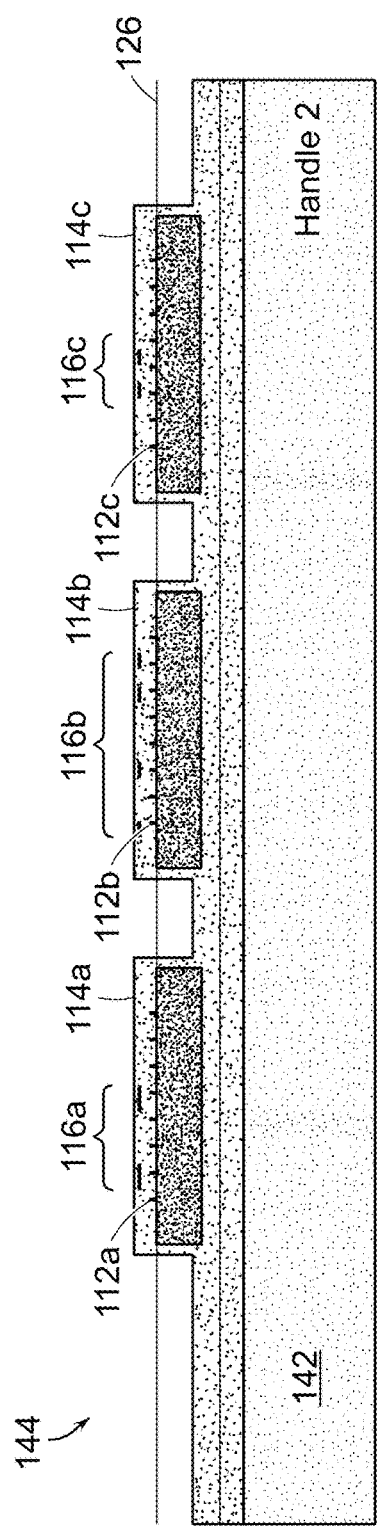
FIG. 6 schematically illustrates a step of flipping the wafer structure to a preferred orientation and removal of the first handle wafer.
Figure 7:
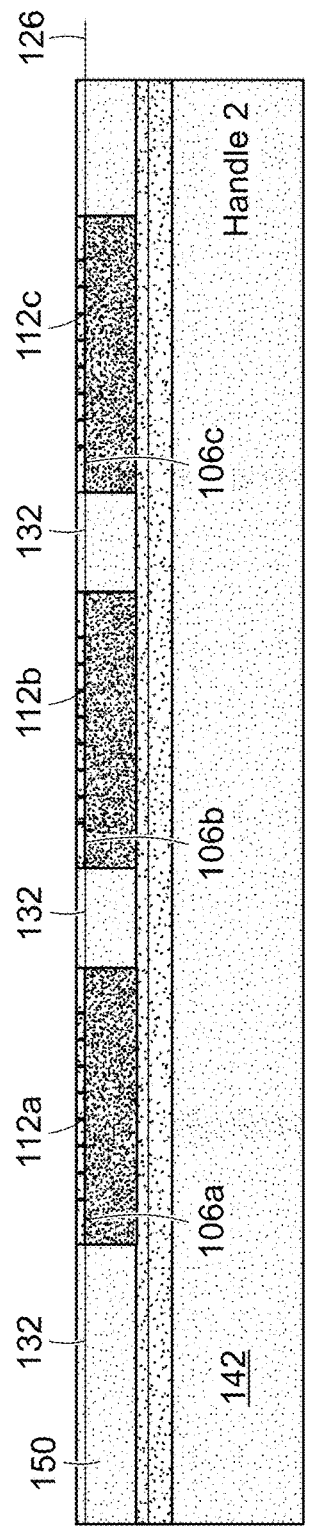
FIG. 7 schematically illustrates a step of removing a protective planarized oxide layer and potential debris regions form the die, and revealing the device die post structures.

As shown in FIG. 6, an intermediate wafer assembly 144 may be flipped to a preferred orientation to allow processing on the first wafer handle 118. Backgrinding and CMP may then be applied to remove the first handle wafer 118 from the assembly, resulting in exposure of the protective planarized oxide layers 114a-114c covering the post structures 112a-112c. As noted, within the planarized oxide layers 114a-114c may be regions 116a-116c of potential singulation and/or handling debris. With reference to FIG. 7, if necessary another polymeric fill 150 may be applied to the gaps 132 prior to backgrinding and CMP of the protective planarized oxide layers 114a-114c on face sides 106a-106c of the die in order to remove the planarized oxide layers 114a-114c and the regions 116a-116c of potential debris, and to reveal the metalized post structures 112a-112c in common plane 126. If a polymer fill 150 was used, it may be removed, resulting in a final composite wafer structure that is ready for use in subsequent standard wafer to wafer bonding processes.

The method embodiments described above may employ existing tooling and materials, and provide advantages over currently used bonding methods including, but not limited to, the ability to integrate device dies of dissimilar thicknesses from different technologies, e.g., CMOS, optoelectronics, MEMS, and other microelectronic devices. In addition, the yield of the resulting devices may be increased by incorporating only known-good die into the devices and the elimination of potential die singulation and handling debris, thereby significantly improving yield. Furthermore, the ability to bond thin dies allows for the stacking of multiple device layers, including those from different technologies, connected vertically while maintaining a low-profile package.

It will be understood that the architectural and operational embodiments described herein are exemplary of a plurality of possible arrangements to provide the same general features, characteristics, and general system operation. Modifications and alterations will occur to others upon a reading and understanding of the preceding detailed description. It is intended that the disclosure be construed as including all such modifications and alterations. Thus, the breadth and scope of the present disclosure should not be limited by any of the above-described exemplary embodiments, but should be defined only in accordance with the following claims appended hereto and their equivalents.

What is claimed is:

1. A method of bonding one or more die to a wafer, comprising:
   receiving a plurality of die, each die having a face side, a substrate material back side, and a thickness, each respective die face side including a planarized oxide layer protecting one or more metallized post structures connecting to a device structure formed in the die;
   bonding each respective die face side of the plurality of die to a front side of a first handle wafer, such that the metallized post structures associated with each of the die lie in a common plane;
   thinning each of the substrate material back sides of the bonded plurality of die to a uniform thickness;
   deposit bonding a $SiO_2$ layer on the respective backsides of the plurality of die and an exposed front side of the first handle wafer;
   bonding the back sides of the uniformly thinned plurality of die to a front side of a second handle wafer;
   removing the first handle wafer by thinning; and
   removing the planarized oxide layers from each respective die face side of the plurality of uniformly thinned die to reveal the one or more metallized post structures.

2. The method of claim 1, wherein the thickness of at least one of the die is different from the other die.

3. The method of claim 1, wherein the protective planarized oxide layer associated with each die includes a region of potential die singulation and handling debris, such that removal of the protective planarized oxide layers also removes the regions of the potential die singulation and handling debris.

4. The method of claim 1, further comprising:
   fabricating each of the die device structures on distinct device wafers;
   protecting each of the die device structures with associated oxide layers; and
   singulating the die.

5. The method of claim 1, wherein at least one of the die comprises a compound device.

6. The method of claim 1, wherein backgrinding and CMP are applied to uniformly thin the substrate material back sides of the bonded die.

7. The method of claim 1, further comprising removing the second handle wafer by thinning in order to expose the die.

8. The method of claim 1, wherein each die comprises a Known Good Die and the second wafer has a diameter of approximately 200 mm.

9. The method of claim 1, wherein bonding the respective die face sides to the front side of the first handle wafer comprises application of a low temperature oxide bonding process to the respective die face sides and first handle wafer front sides.

10. The method of claim 1, wherein bonding the respective die face sides to the front side of the first handle wafer comprises application of an adhesive between the respective die face sides and first handle front sides.

11. The method of claim 1, wherein bonding the uniformly thinned die back sides to the front side of the second handle wafer comprises application of a low temperature oxide bonding process to the uniformly thinned die back sides and the second handle front side.

12. The method of claim 1, wherein bonding the uniformly thinned die back sides to the front side of the second handle wafer comprises application of an adhesive between the uniformly thinned die back sides and the second handle front side.

13. The method of claim 1, further comprising:
   filling gaps between each of the die bonded to the first handle wafer with a strength enhancing polymeric material prior to thinning; and
   removing the polymeric gap filling material either prior to depositing the $SiO_2$ layer or after removing the first handle wafer.

14. The method of claim 1, wherein bonding the respective die face sides to the first handle wafer further comprises precisely referencing each of the die within a predetermined percentage of a pitch of the associated metallized post structure of the die.

* * * * *